(12) United States Patent
Nakanishi et al.

(10) Patent No.: US 8,965,469 B2
(45) Date of Patent: Feb. 24, 2015

(54) OXIDE SUPERCONDUCTOR CABLING AND METHOD OF MANUFACTURING OXIDE SUPERCONDUCTOR CABLING

(75) Inventors: Tatsuhisa Nakanishi, Tokyo (JP); Yuji Aoki, Tokyo (JP); Tsutomu Koizumi, Tokyo (JP); Atsushi Kaneko, Tokyo (JP); Takayo Hasegawa, Tokyo (JP)

(73) Assignee: SWCC Show Cable Systems Co., Ltd., Tokyo (JP)

( * ) Notice: Subject to any disclaimer, the term of this patent is extended or adjusted under 35 U.S.C. 154(b) by 166 days.

(21) Appl. No.: 13/578,344

(22) PCT Filed: Feb. 10, 2011

(86) PCT No.: PCT/JP2011/000774
§ 371 (c)(1),
(2), (4) Date: Dec. 20, 2012

(87) PCT Pub. No.: WO2011/099301
PCT Pub. Date: Aug. 18, 2011

(65) Prior Publication Data
US 2013/0085071 A1 Apr. 4, 2013

(30) Foreign Application Priority Data
Feb. 12, 2010 (JP) ................. 2010-029119

(51) Int. Cl.
*H01B 12/06* (2006.01)
*H01L 39/24* (2006.01)
(Continued)

(52) U.S. Cl.
CPC ............ *H01B 12/02* (2013.01); *H01L 39/2461* (2013.01); *H01B 13/00* (2013.01); *Y10S 505/704* (2013.01)

USPC ........... 505/230; 505/237; 505/238; 505/434; 505/470; 505/704; 174/125.1; 29/599; 428/701; 428/702; 427/62

(58) Field of Classification Search
CPC ........ H01B 12/06; H01B 13/00; H01L 39/24; H01L 39/2458; H01L 39/2461; B32B 18/00
USPC ......... 505/230, 237, 238, 430, 434, 470, 704; 428/472, 701, 702; 174/125.1; 29/599; 427/62
See application file for complete search history.

(56) References Cited

U.S. PATENT DOCUMENTS 6,522,236 B1 * 2/2003 Ries ................................. 338/13
6,828,507 B1 * 12/2004 Fritzemeier et al. ....... 174/125.1
(Continued)

FOREIGN PATENT DOCUMENTS

CN  101490861 A  7/2009
JP  62-023118 A  1/1987
(Continued)

*Primary Examiner* — Stanley Silverman
*Assistant Examiner* — Kallambella Vijayakumar
(74) *Attorney, Agent, or Firm* — Kubotera & Associates, LLC

(57) ABSTRACT

Disclosed are an oxide superconductor tape and a method of manufacturing the oxide superconductor tape capable of improving the length and characteristics of superconductor tape and obtaining stabilized characteristics across the entire length thereof. A Y-class superconductor tape (10), as an oxide superconductor tape, comprises a tape (13) further comprising a tape-shaped non-oriented metallic substrate (11), and a first buffer layer (sheet layer) (12) that is formed by IBAD upon the tape-shaped non-oriented metallic substrate (11); and a second buffer layer (gap layer) (14), further comprising a lateral face portion (14a) that is extended to the lateral faces of the first buffer layer (sheet layer) (12) upon the tape (13) by RTR RF-magnetron sputtering.

9 Claims, 4 Drawing Sheets

(51) Int. Cl.
  *H01B 13/00* (2006.01)
  *H01B 12/02* (2006.01)

(56) References Cited

U.S. PATENT DOCUMENTS

| | | | |
|---|---|---|---|
| 7,247,340 B2 * | 7/2007 | Salagaj et al. | 427/62 |
| 7,627,356 B2 * | 12/2009 | Zhang et al. | 505/231 |
| 8,326,387 B2 * | 12/2012 | Miura et al. | 505/230 |
| 2004/0026118 A1 * | 2/2004 | Muroga et al. | 174/125.1 |
| 2005/0139380 A1 * | 6/2005 | Knoll et al. | 174/125.1 |
| 2005/0173679 A1 * | 8/2005 | Mannhart et al. | 252/500 |
| 2011/0319271 A1 * | 12/2011 | Selvamanickam et al. | 505/231 |

FOREIGN PATENT DOCUMENTS

| | | | |
|---|---|---|---|
| JP | 2004-071359 A | | 3/2004 |
| JP | 2004-171841 A | | 6/2004 |
| JP | 2009-164010 | * | 7/2009 |
| JP | 2009-164010 A | | 7/2009 |

* cited by examiner

OXIDE SUPERCONDUCTOR CABLING AND METHOD OF MANUFACTURING OXIDE SUPERCONDUCTOR CABLING

TECHNICAL FIELD

The present invention relates to oxide superconductor tape and a method of manufacturing the same, and more particularly to improvement of a buffer layer of Y-class superconductor tape.

BACKGROUND ART

Among oxide superconductor tapes, the $YBa_2Cu_3O_{7-x}$ (hereinafter referred to as YBCO for convenience) superconductor tape generally has a structure in which one or, more biaxially oriented inorganic thin film layers are formed on a metallic substrate, and a superconductive film and stabilization layer are formed sequentially thereon. Since its crystals are biaxially oriented, this tape has a higher critical current value (Ic) than bismuth-class Ag sheathed tape, and has excellent magnetic field properties at the liquid nitrogen temperature, so that use of this tape offers the advantage of enabling superconductor devices currently used at low temperatures around the liquid helium temperature to be used at elevated temperatures.

Also, since the superconductive properties of an oxide superconductor change according to its crystal orientation, in order to improve Jc it is necessary to improve the in-plane crystal orientation and thus to form an oxide superconductor on a tape-shaped substrate. Consequently, a film deposition process is used in which an oxide superconductor is epitaxially grown on a substrate having high in-plane crystal orientation.

In this case, in order to improve Jc, it is necessary to maintain good superconductive state quantum bonding by orienting the c-axis of the oxide superconductor vertically with respect to the surface of the substrate and orienting the a-axis (or b-axis) of the oxide superconductor in plane so as to be in parallel to the substrate surface. Consequently the in-plane orientation and c-axis orientation of crystals in the superconductive layer crystal have been improved by forming a buffer layer that has improved in-plane crystal orientation and c-axis crystal orientation on a metallic substrate having high in-plane crystal orientation, and using the crystal lattice of this buffer layer as a template. Also, in order to improve the Ic value, it is necessary for the oxide superconductor film formed on the substrate to be made thicker.

The conduction characteristic (Jc) of a superconductor depends on the crystallinity and surface smoothness of an buffer layer, and it has been proved that this characteristic changes sensitively according to the state of the base.

Various film deposition methods are currently being studied for YBCO superconductor tapes, and IBAD (Ion Beam Assisted Deposition) and RABiTs (registered trademark: Rolling Assisted Biaxially Textured Substrate) are known as manufacturing technologies for a biaxially oriented metallic substrate whereby an buffer layer with in-plane oriented crystals is formed on a tape-shaped metallic substrate used therefor. Many YBCO superconductor tapes have been reported in which an buffer layer that has improved in-plane crystal orientation and c-axis crystal orientation is formed on a non-oriented or oriented metallic tape. For example, a rare-earth-class tape-shaped superconductor is known in which a substrate of Ni or an Ni-based alloy having an orientation texture through heat treatment after rolling is used as a substrate, and an Ni-oxide thin layer, an oxide buffer layer such as a $CeO_2$ (cerium oxide) or like layer formed by means of MOD (Metal Organic Deposition) process, and a YBCO superconductive layer, are formed sequentially on the surface thereof (see Patent Literature 1, for example).

Of these, the method using an IBAD substrate has enabled the highest performance to be obtained. In this method, a buffer layer ($CeO_2$, $Y_2O_3$, YSZ, or the like) or two-layered buffer layer (YSZ, $Gd_2Zr_2O_7/CeO_2$, $Y_2O_3$, or the like), which has high crystal orientation and suppresses reactions with constituent elements of a superconductor, is deposited on a high-strength, nonmagnetic tape-shaped Ni-class substrate (such as hastelloy) by laser deposition in which particles generated from a sputtering target is deposited while irradiating the substrate with ions from a direction diagonal to the substrate, followed by deposition of $C_eO_2$ thereon by means of PLD (Pulsed Laser Deposition) and deposition of a YBCO superconductive layer on $C_eO_2$ by means of PLD (see Patent Literature 2, for example), to form a superconductor tape. Below, $Gd_2Zr_2O_7$ is referred to simply as GZO.

$CeO_2$ is used as a buffer layer of a Y-class superconductor. A $CeO_2$ buffer layer is known as one of the best buffer layers because it has good bonding with a YBCO superconductive layer, and is less reactive with a YBCO superconductive layer.

The roles of a $CeO_2$ buffer layer constituting the base of a superconductive layer include providing good lattice compatibility between an oxide superconductor layer and GZO buffer layer, suppressing elemental diffusion of the metallic substrate, and so forth. It is known that the crystal grain orientation of the $CeO_2$ buffer layer greatly affects the crystal orientation and critical current value (Ic) of the superconductive layer above. That is to say, the superconductive properties of the YBCO film are greatly influenced by the in-plane crystal orientation and surface smoothness of the $CeO_2$ buffer layer.

In the $CeO_2$ buffer layer manufacturing process, PLD, with which there is little compositional deviation between a target and a manufactured film, and that enables film formation in a high-oxygen concentration atmosphere, is used for oxide film formation. Also, secondary effects of using PLD include self-epitaxy, i.e., the in-plane crystal grain orientation ($\Delta\phi$) of the $CeO_2$ film sharply increases with increasing thickness, and high-speed film deposition, when the $CeO_2$ film is formed on the GZO buffer layer.

CITATION LIST

Patent Literature

PTL 1 Japanese Patent Application Laid-Open No. 2004-171841
PTL 2 Japanese Patent Application Laid-Open No. 2004-71359

SUMMARY OF INVENTION

Technical Problem

In the elongation of YBCO superconductor tape, a requirement is that there should be no local degradation over the entire length thereof. There are many possible causative factors in local degradation. For example, in the case of YBCO tape having a structure in which a buffer layer comprising two layers of GZO and $CeO_2$, and a superconductive layer are laminated on a tape-shaped metallic substrate, it is essential for the strength of the GZO and $CeO_2$ buffer layers to be extremely low with respect to the mechanical strength of the tape-shaped metallic substrate, and for the two buffer layers to be maintained during elongation. In particular, it is possible that a $CeO_2$ buffer layer deposited on a GZO buffer layer may be susceptible to damage due to becoming the tape surface in subsequent YBCO film deposition by means of TFA-MOD, and may peel off when subjected to stress such as bending. However, a $CeO_2$ buffer layer has good compatibility with a YBCO superconductive layer and is less reactive with respect to a YBCO superconductive layer, making it indispensable as the best buffer layer.

In particular, the following characteristic problem occurs when depositing a superconductive layer by means of MOD.

Specifically, the surface tape exposed to a solution used in MOD is a CeO layer. The GZO buffer layer is known to be vulnerable to acid, and at least a lateral face of a GZO layer is exposed to a solution used in MOD. In particular, when a superconductive layer is deposited by means of MOD, there is a characteristic problem of the solution infiltrating the respective layer interfaces from an interface location between the first buffer layer (GZO layer) and second buffer layer (CeO layer), or an interface location between the first buffer layer (GZO layer) and the substrate.

It is an object of the present invention to provide an oxide superconductor tape and a method of manufacturing a superconductor tape capable of preventing peeling of layers from a CeO layer that occurs when depositing a superconductive layer by means of MOD, and of increasing acid resistance.

Solution to Problem

An oxide superconductor tape of the present invention includes a tape-shaped metallic substrate; a first buffer layer disposed on the tape-shaped metallic substrate; and a second buffer layer disposed on the first buffer layer, wherein the second buffer layer is extended to a lateral face of the first buffer layer.

A method of manufacturing an oxide superconductor tape of the present invention is a method of depositing a second buffer layer on a tape in which a first buffer layer composed of one or more layers are deposited on a tape-shaped metallic substrate, the method including: moving the tape between a pair of turn reels at a constant speed through a sputtering film formation area; a step of looping back the tape that moves through the sputtering deposition area through a plurality of turns; and a step of depositing a vapor deposition material discharged from a target so as to wrap around a lateral face of the tape, so that the second buffer layer forms a thin film that is extended to a lateral face of the first buffer layer.

Advantageous Effects of Invention

The present invention can prevent peeling of layers from a CeO layer that occurs when depositing a superconductive layer by means of MOD, and can increase acid resistance. By this means, an oxide superconductor tape and a method of manufacturing oxide superconductor tape can be implemented that are capable of improving the elongation and characteristics of superconductor tape, and that enable stable characteristics to be obtained over the entire length thereof.

DESCRIPTION OF EMBODIMENTS

Now, embodiments of the present invention will be described in detail with reference to the accompanying drawings.

Embodiment 1

Figure 1:
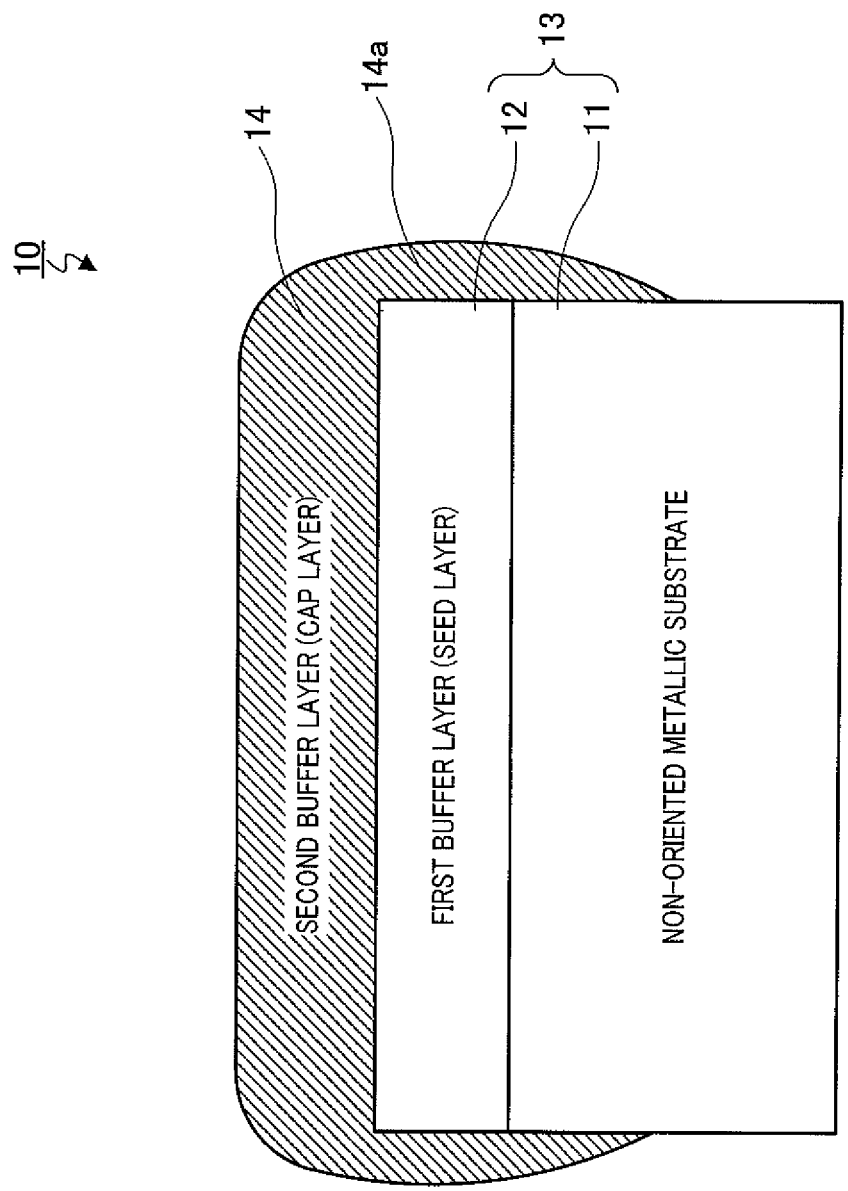
FIG. 1 is a cross-sectional drawing showing the film structure of buffer layers of a tape-shaped oxide superconductor according to Embodiment 1 of the present invention.

FIG. 1 is a cross-sectional view the film structure of buffer layers of a tape-shaped oxide superconductor according to Embodiment 1 of the present invention. This embodiment is an example of application to an oxide superconductor having two buffer layers.

As shown in FIG. 1, Y-class superconductor tape 10 is provided with tape 13 includes tape-shaped non-oriented metallic substrate 11 and first buffer layer (seed layer) 12 deposited on tape-shaped non-oriented metallic substrate 11 using IBAD, and second buffer layer (cap layer) 14 deposited on tape 13 by means of RF (radio frequency)-sputtering and has lateral face portion 14a that is extended to the lateral faces of first buffer layer 12.

In this embodiment, deposition of second buffer layer 14 is performed not by means of common RF-sputtering but by film deposition apparatus 100 (see FIG. 3) having a configuration that combines RF-sputtering, an RTR (Reel-to-Reel) tape moving mechanism, and a multi-turn mechanism that performs multi-turning of tape and passes it over a target, as described later herein. Below, a scheme combining RF-sputtering, RTR tape moving mechanism, and multi-turn mechanism is referred to as RTR RF-magnetron sputtering or RF-sputtering by film deposition apparatus 100.

Film deposition apparatus 100 of this embodiment (see FIG. 3) allows adjustment of RF-Sputtering film deposition conditions, RTR tape moving mechanism tape travel or suchlike movement conditions, and turn setting conditions of the multi-turn mechanism. By this means, second buffer layer 14 is not only deposited on first buffer layer 12, but also deposited as lateral face portion 14a on the lateral faces of first buffer layer 12. Deposition of this lateral face portion 14a is possible as far as the lateral faces of tape-shaped non-oriented metallic substrate 11 by means of the above adjustments. It is also possible for deposition of lateral face portion 14a not to be performed.

Non-oriented metallic substrate 11 is a high-strength tape-shaped metallic substrate that includes a nonmagnetic alloy with cubic system having Hv=150 or above, typified by a material such as an Ni—Cr-class material (specifically, Ni—Cr—Fe—Mo-class hastelloy B, C, X, or the like), a W—Mo-class material, an Fe—Cr-class material (for example, austenitic stainless steel), an Fe—Ni-class material (for example, a material of nonmagnetic composition), and so forth. When textured by being subjected to 90%-plus hot rolling followed by heat treatment at the recrystallization temperature or above, these classes of alloy exhibit good crystal orientation.

First buffer layer 12 is composed of $Gd_2Zr_2O_7$ (GZO), yttrium-stabilized zirconia (YSZ), MgO, or the like, and is deposited on non-oriented metallic substrate 11 by means of IBAD. First buffer layer 12 is a seed layer for fabricating a biaxially-oriented ceramic layer on an oriented metallic substrate, and is a diffusion prevention layer for preventing an element from non-oriented metallic substrate 11 diffusing into the superconductive layer to cause degradation of superconductivity.

A feature of this embodiment is that $CeO_2$ is deposited by means of deposition apparatus 100 (see FIG. 3) RF-sputtering on tape 13 in which first buffer layer 12 (for example, $Gd_2Zr_2O_7$) is deposited on tape-shaped non-oriented metallic substrate 11 (for example, hastelloy), and deposits second buffer layer 14 having lateral face portion 14a that is extended to the lateral faces of first buffer layer 12.

Second buffer layer 14 increases the lattice compatibility between an oxide superconductor and first buffer layer 12, and suppresses diffusion of an element (Zr, or the like) composing first buffer layer 12. Second buffer layer 14 provides good lattice compatibility, for example, between a buffer layer that causes growth of a c-axis oriented Re-class (123) superconductive layer and a superconductive layer.

In second buffer layer 14, $CeO_2$ is used as a Y-class superconductor buffer layer. A $CeO_2$ buffer layer is known as one of the best buffer layers because it has good bonding with a YBCO superconductive layer is less reactive with the YBCO superconductive layer. Second buffer layer 14 may be a Ce—Gd—O film in which a predetermined amount of Gd is added to a $CeO_2$ film, or a film composed of a Ce—M—O-class oxide in which part of the Ce is partially replaced by another metal atom or metal ion.

Second buffer layer 14 is deposited on first buffer layer 12 by means of RTR RF-magnetron sputtering, and is also deposited on the lateral faces of first buffer layer 12 as lateral face portion 14a. Lateral face portion 14a is deposited integrally with and simultaneously with the principal surface of first buffer layer 12.

Second buffer layer 14 is an acid-resistant buffer layer, such as a $CeO_2$ film, for example. The $CeO_2$ film of second buffer layer 14 having lateral face portion 14a that is extended to the lateral faces of first buffer layer 12 is an acid-resistant thin film.

The thickness of lateral face portion 14a is preferably ⅕ or less of the thickness of the principal surface of second buffer layer 14. It has been confirmed that, if the thickness of second buffer layer 14 is ⅕ or less of that of the principal surface of second buffer layer 14, peeling of the $CeO_2$ film of second buffer layer 14 is prevented when it is elongated, and stress sufficient to adversely affect YBCO superconducting characteristics does not occur due to the thickness of the $CeO_2$ film of second buffer layer 14 itself.

It is also preferable that lateral face portion 14a be deposited so as to cover at least ½ of the area of the lateral faces of first buffer layer 12.

In particular, when the superconductive layer is to be deposited by means of MOD, there is a characteristic problem of the solution infiltrating the respective layer interfaces from an interface location between first buffer layer 12 (the GZO layer) and second buffer layer 14 (the CeO layer), or an interface location between first buffer layer 12 (the GZO layer) and non-oriented metallic substrate 11. In order to resolve this problem, it is necessary for the interface location to be covered by second buffer layer 14. Therefore, lateral face portion 14a is preferably deposited on at least part of the lateral faces of non-oriented metallic substrate 11, and also on the bottom face thereof.

Also, although the principal surface side of non-oriented metallic substrate 11 has smoothness due to polishing or the like, the lateral face sides and bottom face thereof are rough in comparison with the principal surface. Consequently, if the second buffer layer is deposited on as far as part of the lateral faces of non-oriented metallic substrate 11, the second buffer layer penetrates the rough lateral faces, and second buffer layer 14 becomes less prone to peeling.

Here, lateral face portion 14a is deposited integrally with second buffer layer 14 by means of RTR RF-magnetron sputtering, and is therefore formed with the same composition as second buffer layer 14. As stated above, a $CeO_2$ film is best because it has good compatibility with a YBCO superconductive layer and is less reactive with the YBCO superconductive layer. In addition, the $CeO_2$ film also exhibits superior acid resistance. Incidentally, acid resistance is one reason for using a $CeO_2$ film for a buffer layer when using MOD. In view of the above, both second buffer layer 14 and lateral face portion 14a are formed of a $CeO_2$ film.

Also, with regard to second buffer layer 14, it is known that the crystal grain orientation greatly affects the crystal orientation and critical current value (Ic) of the superconductive layer provided above. In this embodiment, second buffer layer 14 is deposited with a high precision by means of RTR RF-magnetron sputtering. Advantages of RTR RF-magnetron sputtering are that there is little compositional deviation between a target and a manufactured film, and precise deposition is possible, as with PLD, and also that maintenance costs and so forth are lower than with PLD. Second buffer layer 14 film preferably has a thickness of 50 nm to 3 µm. With a thickness of less than 50 nm, it is less effective in preventing elemental diffusion from non-oriented metallic substrate 11, and with a thickness of more than 3 µm there is a possibility of cracks occurring in the film In this embodiment, the thickness of the $CeO_2$ film of second buffer layer 14 is 1 µm, and therefore the thickness of the $CeO_2$ film of lateral face portion 14a is ⅕ or less of that.

If the $CeO_2$ layer is deposited by means of MOD, cracking occurs due to a difference in the coefficient of thermal expansion vis-a-vis the substrate or the like, and a function as a buffer layer is not effected. Such cracking does not occur with the RTR RF-magnetron sputtering of this embodiment.

Figure 2:
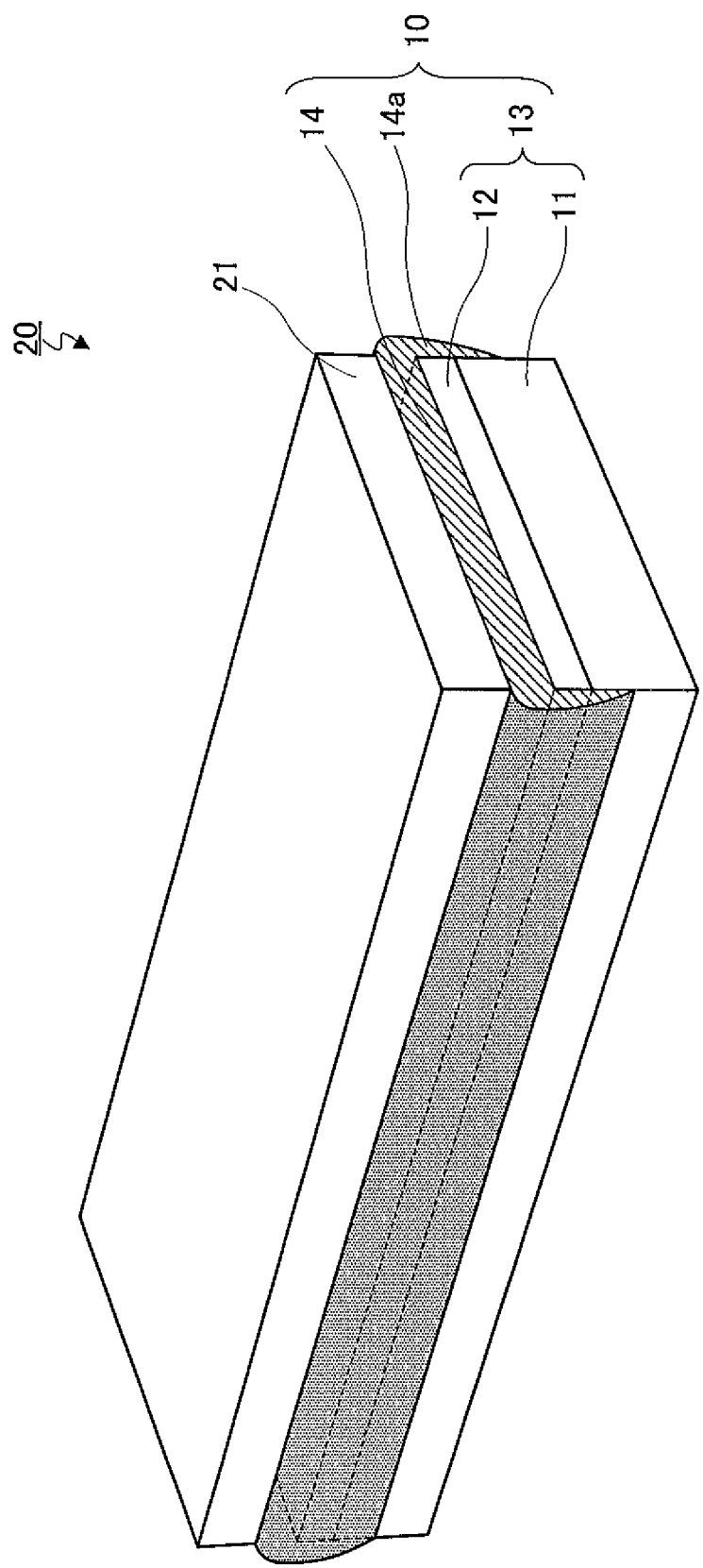
FIG. 2 is a cross-sectional view of a tape-shaped oxide superconductor according to Embodiment 1.

FIG. 2 is a cross-sectional view of a tape-shaped oxide superconductor according to this embodiment.

As shown in FIG. 2, tape-shaped oxide superconductor 20 has YBCO superconductive film 21 deposited by means of TFA-MOD (Trifluoroacetates-Metal Organic Deposition) on second buffer layer 14 with respect to Y-class superconductor tape 10 in which second buffer layer 14 is deposited on tape 13. Second buffer layer 14 and YBCO superconductive film 21 have c-axis and a-axis crystal orientations (in-plane crystal orientation) in accordance with the crystal orientation of the respective lower layer.

With regard to tape-shaped oxide superconductor 20, in the second buffer layer 14 deposition process, lateral face portion 14a is also deposited on the lateral faces of first buffer layer 12 by means of RTR RF-magnetron sputtering. This lateral face portion 14a is a dense $CeO_2$ film integrally deposited at the same time as deposition of second buffer layer 14—that is, at the time of vapor deposition of $CeO_2$ to form second buffer layer 14. Second buffer layer 14 enables the following effects to be expected by being extended as far as first buffer layer 12 as lateral face portion 14a—that is, by deposition of lateral face portion 14a on the lateral faces of first buffer layer 12. (1) Since lateral face portion 14a covers second buffer layer 14 of an upper surface corner of Y-class superconductor tape 10, second buffer layer 14 $CeO_2$ film is resistant to peeling when Y-class superconductor tape 10 is subjected to stress such as bending or pulling. (2) By shielding first buffer layer 12 from the lateral faces, lateral face portion 14a can protect first buffer layer 12 from the acidity of a TFA-MOD solution. In other words, the degree of freedom of selection of the type and strength of a TFA-MOD solution can be extended, and YBCO superconductive film 21 deposition conditions can be optimized.

(1) and (2) above contribute to an improvement in characteristics and a reduction in manufacturing time in elongated manufacture of tape-shaped oxide superconductor 20.

Figure 3:
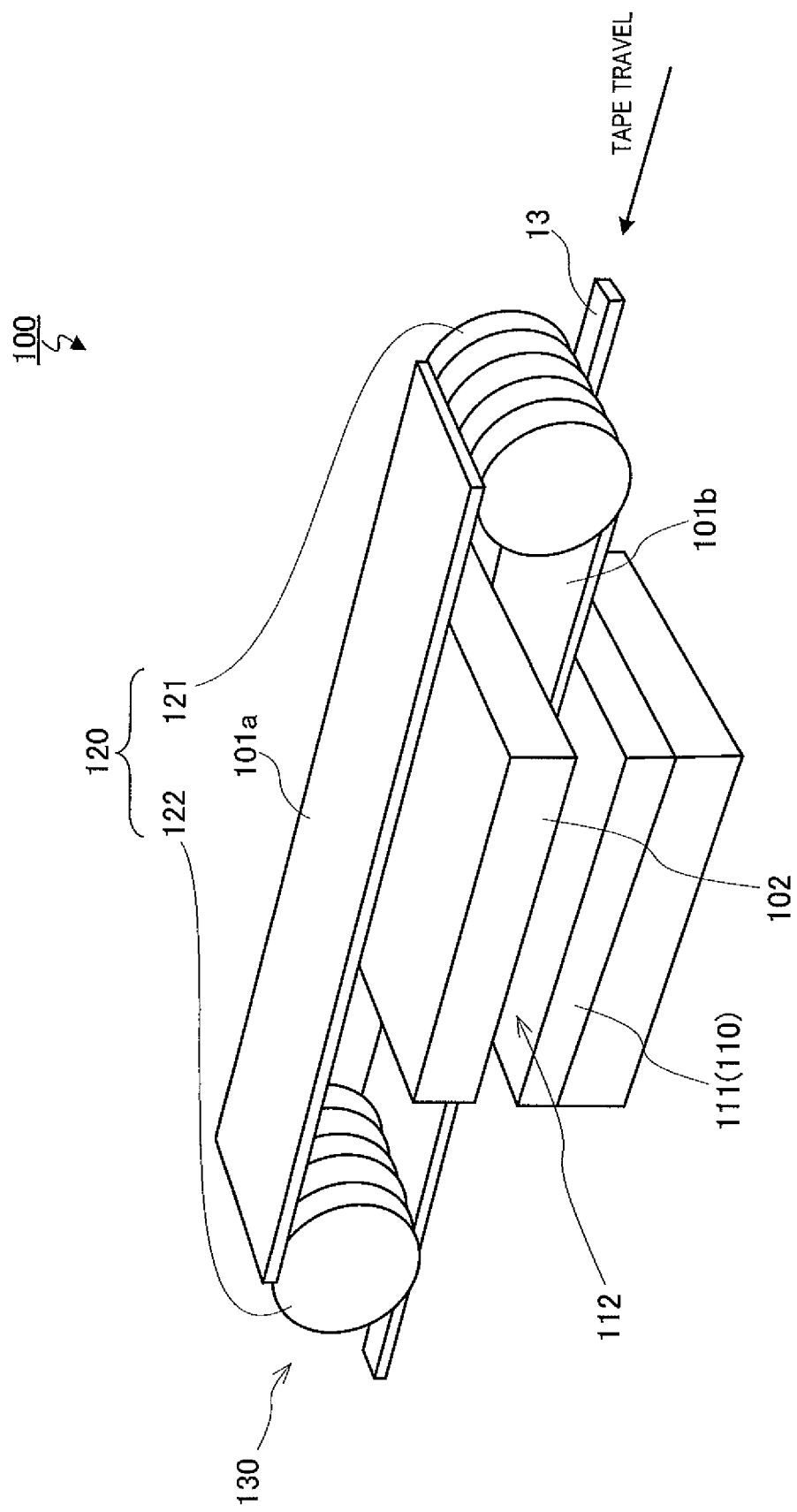
FIG. 3 is a perspective view showing the general configuration of a film deposition apparatus for a tape-shaped oxide superconductor according to Embodiment 1.

FIG. 3 is a perspective view showing the general configuration of film deposition apparatus 100 that performs deposition of second buffer layer 14 of Y-class superconductor tape 10 described above.

Film formation apparatus 100 performs deposition of second buffer layer 14 having lateral face portion 14a on tape 13 in which first buffer layer 12 is deposited on non-oriented metallic substrate 11.

As shown in FIG. 3, film deposition apparatus 100 is provided with tape heater 102 that is positioned between tape holders 101a and 101b supporting tape 13 transported in and transported out and heats traveling tape 13 transported out on tape holder 101b, and RF-Sputtering apparatus 110.

RF-Sputtering apparatus 110 has tabular target 111 (here, a $CeO_2$ target) positioned opposite tape heater 102 below tape holder 101b, and a high frequency application apparatus (not shown) that applies a high-frequency voltage to target 111. The high frequency application apparatus deposits $CeO_2$ (the vapor deposition material) discharged from target 111 by means of corona discharge or the like on the surface of tape 13 and forms a thin film. The $CeO_2$ film deposited on the principal surface of tape 13 forms the principal surface of second buffer layer 14, and the $CeO_2$ film deposited on the lateral faces of tape 13 forms lateral face portion 14a.

In FIG. 3, the upper position of the surface of target 111 forms sputtering deposition area 112 by means of RF-Sputtering apparatus 110.

Film formation apparatus 100 is also provided with RTR tape moving mechanism 120 that comprises a pair of turn reels 121 and 122 positioned at either end of sputtering deposition area 112 and that moves tape 13 between turn reels 121 and 122 at a constant speed through sputtering deposition area 112, and multi-turn mechanism 130 that winds tape 13 between turn reels 121 and 122, giving tape 13 multiple (here, five) turns, and passes tape 13 through sputtering deposition area 112.

Since multi-turn mechanism 130 moves tape 13 through sputtering deposition area 112 through a plurality of turns (preferably five or more), it offers the advantage of increasing the deposition rate compared with the RTR process.

Also, in order to perform deposition so that a second buffer layer is wrapped around the lateral faces of tape 13 as far as a desired position, in addition to this structure whereby tape 13 passes through sputtering deposition area 112 a plurality of times, there is a need for multi-turn mechanism 130 that loops back tape 13 moved by RTR tape moving mechanism 120 through a plurality of turns separated by a predetermined interval.

Such a predetermined interval may be a predetermined interval such that deposition is performed so that the second buffer layer is wrapped as far as a desired position, and an interval of around 3 to 20 mm is desirable. In any case, by having an RTR RF-magnetron sputtering process combining RF-Sputtering apparatus 110, RTR tape moving mechanism 120, multi-turn mechanism 130, and so forth, $CeO_2$ deposition is performed so as to wrap around the lateral faces of tape 13.

If multi-turning is not adopted, such an interval does not occur, and furthermore, unless this structure is used whereby tape 13 passes through sputtering deposition area 112 a plurality of times, $CeO_2$ is not deposited with a sufficient thickness and so as to wrap around the lateral faces, and so forth.

With film deposition apparatus 100, RF-Sputtering apparatus 110, RTR tape moving mechanism 120, and multi-turn mechanism 130 are all housed in a film deposition container (chamber) (not shown). Also, RF-Sputtering apparatus 110 generates a charge inside the above chamber. RF-Sputtering apparatus 110 may be provided with a mechanism that automatically adjusts the impedance inside the chamber, and if such a configuration is used the stability of film deposition can be improved.

Here, in order to secure a large deposition area, target 111 may have a plurality of target materials stuck together in a tile arrangement. Using such a tile arrangement enables a large-sized oxide target to be mounted. Target 111 is for forming a desired polycrystalline thin film, and a target that has a composition identical or similar to that of the desired polycrystalline thin film is used, for example. As target 111, a $CeO_2$ target is used, but is not limited to this.

Example

As shown in FIG. 2, tape-shaped oxide superconductor 20 has a structure in which $Gd_2Zr_2O_7$ (GZO) first buffer layer 12, $CeO_2$ second buffer layer 14 having lateral face portion 14a, and YBCO superconductive layer 21, are laminated on non-oriented metallic substrate 11.

With regard to the substrate used, tape 13 is used in which a GZO layer is deposited by means of IBAD on a 100 m long hastelloy tape 100 µm thick×10 mm wide.

Using film deposition apparatus 100 having RTR RF-magnetron sputtering shown in FIG. 3, $CeO_2$ second buffer layer 14 having lateral face portion 14a is deposited on tape 13.

The deposition conditions are as follows.

Set temperature of tape heater 102: 400 to 900° C.

RF applied power of RF-Sputtering apparatus 110: 0.5 to 2 kW

Gas pressure inside chamber: 1 to 100 mTorr

As shown in FIG. 3, film deposition apparatus 100 has a structure combining RF-Sputtering apparatus 110, RTR tape moving mechanism 120, and multi-turn mechanism 130.

Having RF-Sputtering apparatus 110 enables deposition of $CeO_2$ second buffer layer 14 to be performed without using PLD. Also, having RTR tape moving mechanism 120 enables deposition of $CeO_2$ second buffer layer 14 to be performed on elongated tape 13. Furthermore, having multi-turn mechanism 130 enables tape 13 to pass through sputtering deposition area 112 five times, and enables high-rate deposition to be achieved.

Furthermore, having RTR RF-magnetron sputtering combining RF-Sputtering apparatus 110 and RTR tape moving mechanism 120 in film deposition apparatus 100 not only enables the above respective functions to be implemented, but also makes it possible to implement a function specific to this embodiment. That is to say, using an RTR process and RF-Sputtering in multi-turning enables deposition of lateral face portion 14a on the lateral faces of first buffer layer 12 to be performed at the same time as deposition of $CeO_2$ second buffer layer 14. To be more specific, since an RTR process and multi-turning are used, in each multi-turn a predetermined interval occurs between adjacent tapes 13. $CeO_2$ is deposited by means of RF-Sputtering so as to wrap around the lateral faces of tape 13 between portions of tapes 13 produced by multi-turning. If multi-turning is not adopted, such an interval does not occur, and furthermore, unless this structure is used whereby tape 13 passes through sputtering deposition area 112 five times, $CeO_2$ is not deposited with a sufficient thickness.

An experiment to investigate stable deposition of an elongated buffer layer over a long period was conducted in which simulated elongated tape was manufactured such that a 20 cm long IBAD-GZO substrate was connected to a hastelloy lead at 10 mm intervals.

Evaluation of manufactured $CeO_2$ second buffer layer 14 was carried out using X-ray diffraction, with evaluation carried out with a strength of (200) for crystallinity and θ to 2θ for c-axis orientation. For crystal grain orientation of $CeO_2$ second buffer layer 14, pole figure measurement was performed, and an average of four φ scan peak half widths (Δφ) indicating symmetry was taken and evaluated. Evaluations of the surface shape and film surface smoothness of $CeO_2$ second buffer layer 14 were carried out by means of SEM (Scanning Electron Microscopy) and AFM (Atomic Force Microscopy) respectively.

An efficacy evaluation of $CeO_2$ film as second buffer layer (cap layer) 14 was carried out by actually manufacturing YBCO superconductive film 21 by means of TFA-MOD, and measuring the critical current (Ic) of the superconductive film. A direct current four-poles method was used for Ic value measurement, with definition based on a 1 μV/cm field reference.

The results of the experiment showed a good conduction characteristic for YBCO superconductive layer 21 on a $CeO_2$ second buffer layer manufactured by means of sputtering, demonstrating that it can be satisfactorily used as a buffer layer of YBCO tape.

In this embodiment, RTR RF-magnetron sputtering was used, RF applied power was increased, and a multi-turn mechanism for extending the deposition area was implemented. As a result, the Δφ distribution with respect to a lengthwise orientation indicated a Δφ value of 6° or less (film thickness: 1.4 μm) over the entire length, and a $CeO_2$ buffer layer film was formed that has crystals oriented extremely uniformly in-plane.

A CeO2 second buffer layer film with an in-plane crystal grain orientation (Δφ) of 6° or less was successfully elongated by means of RTR RF-magnetron sputtering, and it was demonstrated that application is possible as a high-performance YBCO tape buffer layer using sputtering instead of PLD.

As described in detail above, Y-class superconductor tape 10 of this embodiment is provided with tape 13 composed of tape-shaped non-oriented metallic substrate 11 and first buffer layer (seed layer) 12 deposited on tape-shaped non-oriented metallic substrate 11 using IBAD, and second buffer layer 14 on tape 13 having lateral face portion 14a that is extended to the lateral faces of first buffer layer 12 by means of RF-magnetron sputtering. That is to say, Y-class superconductor tape 10 employs a structure in which second buffer layer 14 is extended as lateral face portion 14a so as to cover at least the lateral faces of first buffer layer 12.

By this means, second buffer layer 14 of an upper surface corner of Y-class superconductor tape 10 is extended to the lateral faces of first buffer layer 12, and covers first buffer layer 12 as lateral face portion 14a, enabling the $CeO_2$ film of second buffer layer 14 to resist peeling when Y-class superconductor tape 10 is subjected to stress such as bending or pulling. Also, by shielding first buffer layer 12 from the lateral faces, lateral face portion 14a can protect first buffer layer 12 from the acidity of a TFA-MOD solution.

Incidentally, there are the following problems with a conventional $CeO_2$ buffer layer manufacturing process due to the use of PLD.

(1) The equipment price is high.

(2) Equipment maintenance costs are high since replacement of the laser oscillation tube is necessary every few years.

(3) Unmanned operation during manufacture is difficult due to laser energy variation with time in extended operation.

(4) The laser beam burns dust and so forth adhering to the glass surface of a laser beam introduction viewing port, reducing the transparency of the viewing port over time. Together with this, the intensity of the laser beam reaching the target decreases, and film quality degrades.

In contrast, film deposition apparatus 100 of this embodiment is provided with RF-sputtering apparatus 110 that deposits $CeO_2$ discharged from target 111 on tape 13 by means of high-frequency application and forms second buffer layer 14 having lateral face portion 14a that is extended to the lateral faces of first buffer layer 12, RTR tape moving mechanism 120 that moves tape 13 between a pair of turn reels at a constant speed through sputtering deposition area 112, and multi-turn mechanism 130 that moves tape 13 through a plurality of turns in sputtering deposition area 112.

Thus, film deposition apparatus 100 has the following effects through performing deposition of $CeO_2$ second buffer layer 14 by means of RTR RF-magnetron sputtering.

(1) The equipment price is lower than in the case of PLD.

(2) Maintenance costs are lower than in the case of PLD.

(3) Extended continuous operation for 100 hours or longer is possible, and unmanned operation is possible since the deposition process is stable over a long period.

(4) A multi-turn structure can be implemented comparatively inexpensively as a means of speeding up operation. In this case, sputtering deposition area 112 can be enlarged by giving target 111 serving as the film material a wide profile, and passing tape 13 over target 111 in a multi-turn fashion.

By means of above effects (1) through (4), equipment costs and running costs can be kept low, and high-rate deposition is possible, in the manufacture of second buffer layer 14 and its lateral face portion 14a. Equipment introduction costs and maintenance costs are low, making this embodiment suitable for mass production.

Embodiment 2

Superconducting characteristics of a YBCO film are greatly influenced by the in-plane crystal orientation, surface smoothness, and so forth of a $CeO_2$ buffer layer. In the case of a $CeO_2$ film, deposition in which cracking does not occur is necessary. Also, when a $CeO_2$ film is formed on a GZO buffer layer by means of PLD, selfepitaxy can be used whereby the in-plane crystal grain orientation (Δφ) of the $CeO_2$ film sharply improves with increasing thickness. For these and other reasons, the buffer layer film is generally formed of multiple layers.

Embodiment 1 is an example of application to an oxide superconductor having two buffer layers. Embodiment 2 describes an example of application to an oxide superconductor having three or more buffer layers.

In the present invention, it is only necessary for a second buffer layer to be extended to the lateral faces of a first buffer layer, and the first and second buffer layers may be any of the buffer layers between a metallic substrate and an oxide superconductor layer. For example, the second buffer layer may be formed directly beneath the oxide superconductor layer.

Also, the first buffer layer may be composed of a plurality of buffer layers. For example, if the first buffer layer comprises two layers, there are three buffer layers. Below, this three-layer example is described according to Embodiment 2. For convenience of description of a case in which deposition of buffer layers is performed sequentially from above the metallic substrate, in Embodiment 2 the second buffer layer of Embodiment 1 corresponds to a third buffer layer.

Figure 4:
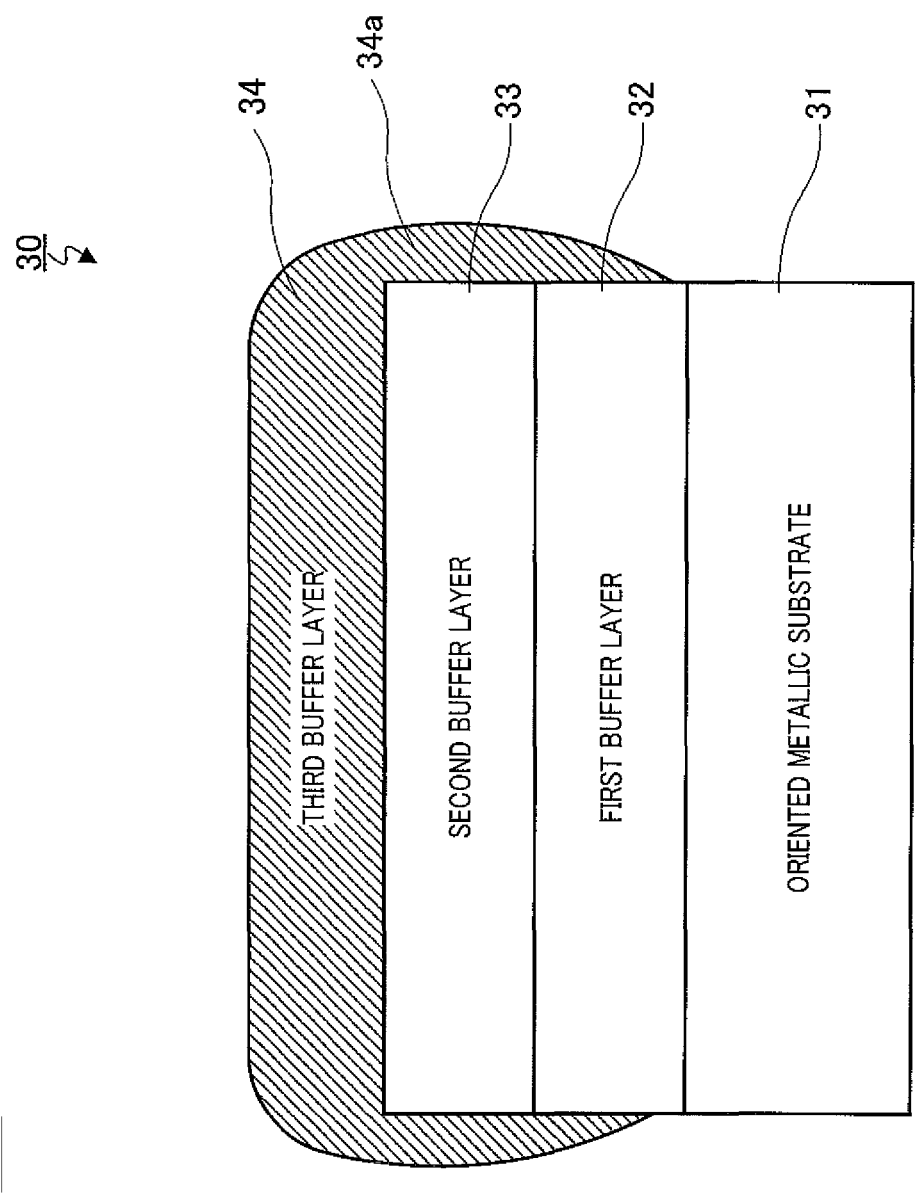
FIG. 4 is a cross-sectional view of the film structure of buffer layers of a tape-shaped oxide superconductor according to Embodiment 2 of the present invention.

FIG. 4 is a cross-sectional view showing the film structure of buffer layers of a tape-shaped oxide superconductor according to Embodiment 2 of the present invention. This embodiment is an example of application to an oxide superconductor having three buffer layers.

As shown in FIG. 4, tape-shaped oxide superconductor 30 has three layered structure of the buffer layer: first buffer layer 32, second buffer layer 33, and third buffer layer 34, having respective specific functions, laminated on oriented metallic substrate 31. After third buffer layer 34 is laminated, an oxide superconductor layer (not shown) is provided, and then a stabilization layer (not shown) of silver or the like having a role of surface protection and the like is provided. As explained above, third buffer layer 34 corresponds to second buffer layer 14 of Embodiment 1 (see FIG. 1).

Oriented metallic substrate 31 is an oriented metallic substrate having biaxial orientation.

First buffer layer 32 is a template layer having the same crystal orientation as oriented metallic substrate 31.

Second buffer layer 33 is a diffusion prevention layer that prevents diffusion of a metallic element composing oriented metallic substrate 31 into the oxide superconductor layer.

Third buffer layer 34 is an orientation control layer that controls the orientation of the superconductive layer and inhibits reactivity.

More particularly, third buffer layer 34 increases lattice compatibility between the oxide superconductor layer and second buffer layer 33, and suppresses elemental diffusion of oriented metallic substrate 31. Third buffer layer 34 is extended to the lateral faces of second buffer layer 33.

Third buffer layer 34 is not only deposited on second buffer layer 33, but also deposited on the lateral faces of second buffer layer 33 as lateral face portion 34a. Deposition of lateral face portion 34a is possible as far as the lateral faces of first buffer layer 32 or oriented metallic substrate 31.

In order to improve the in-plane crystal orientation of the oxide superconductor layer (not shown), it is necessary for above buffer layers 32 through 34 to take on the crystal orientation of biaxially-oriented oriented metallic substrate 31, and consequently it is necessary for oriented metallic substrate 31 to be provided with a biaxially oriented surface layer on at least the side in contact with first buffer layer 32. For oriented metallic substrate 31 of this kind, it is possible to use Ni or an Ni-based alloy or Cu or a Cu-based alloy subjected to predetermined heat treatment after cold rolling, for example an Ni-based alloy in which 0.1 to 15 at % of one or two or more kinds of elements selected from (W, Mo, Ta, V, and Cr) is included in Ni, or a compound metallic substrate including a laminated structure resulting from bonding together these oriented metallic substrates and a metallic substrate having heat resistance and acid resistance (hastelloy, inconel, stainless steel, or the like) and Ni or an Ni-based alloy or Cu or a Cu-based alloy by means of cold rolling, and performing heat treatment at a temperature of 900 to 1300° C. for crystal orientation.

First buffer layer 12 and third buffer layer 34 are preferably formed of $CeO_2$ or Ce-RE1-O, in which case the Ce:RE1 molar ratio is in the range of Ce:RE1=30:70 to (100-α):α (α>0), and preferably Ce:RE1=40:60 to 70:30. The reason for this is that biaxial orientation decreases if the Ce/RE1 ratio is less than 3/7.

The thickness of first buffer layer 32 is preferably in the range of 10 to 100 nm. The reason for this is when the thickness is less than 10 nm the metallic substrate is not completely coated and an improvement in orientation cannot be observed, and if the thickness exceeds 100 nm surface roughness increases, resulting in a marked decrease in the orientation of the second buffer layer and third buffer layer and the superconducting characteristics of the superconductive layer.

Also, the thickness of third buffer layer 34 is preferably in the range of 30 nm or above, since with a thickness of less than 30 nm the superconductive layer and tape 13 react and suffer loss during deposition of the superconductive layer, resulting in a marked decrease in superconducting characteristics.

On the other hand, second buffer layer 33 can be formed of RE2-Zr—O, in which case the RE2:Zr molar ratio is preferably in the range of RE2:Zr=30:70 to 70:30. The thickness of second buffer layer 33 is preferably in the range of 30 nm or above, since with a thickness of less than 30 nm mutual diffusion occurs between the alloy elements composing metallic substrate 10 and the superconductive layer during deposition of the superconductive layer, resulting in a marked degradation of superconducting characteristics.

For the above first through third buffer layers and oxide superconductor layer, it is possible to use any method capable of forming the above oxide, such as metal organic deposition (MOD), RF-sputtering, pulsed laser deposition, EB, CVD, or the like. The first and second buffer layers and the oxide superconductor layer are preferably formed by means of metal organic deposition (MOD). In this case, these buffer layers and oxide superconductor layer can be formed in each case by applying a mixed solution of octoate, naphthenate, neodecanoate or trifluoro acetate containing elements composing the relevant buffer layer or the superconductive layer at a predetermined molar ratio and by heating the solution; the materials are not constrained by these examples, as long as they can be dissolved uniformly in one or more organic solvents and the solution can be applied onto the substrate.

In this case, TFA-MOD is suitable for forming the oxide superconductor layer. This method is known as a manufacturing method by means of a non-vacuum process, and involves coating a substrate with an organometallic salt solution such as trifluoroacetate (TFA) containing alloy elements composing the oxide superconductor layer in a predetermined molar ratio, forming an amorphous precursor by performing pre-heat treatment on this, and then performing crystallization heat treatment and crystallizing the precursor to form an oxide superconductor layer.

Spin coating, dip coating, injection coating, and so forth are possible metallic substrate coating methods, but the method is not constrained by these examples as long as a uniform film can be formed on the substrate.

In-plane orientation of first buffer layer 11 when using MOD is formed in the range of around −2 degrees to +5 degrees with respect to half width Δφ by means of X-ray diffraction of oriented metallic substrate 31 having biaxial orientation, but the in-plane crystal orientation of the first through third buffer layers is preferably kept in the range of ±1.0 degree with respect to half width Δφ of biaxially-oriented oriented metallic substrate 10.

Thus, according to this embodiment, tape-shaped oxide superconductor 30 is provided with third buffer layer 34 that is extended to the lateral faces of second buffer layer 33. By this means, the same kind of effect as in Embodiment 1 can be obtained—that is, the specific problem of a solution infiltrating an interface location between second buffer layer 33 and third buffer layer 34 (a CeO layer) during deposition of a superconductive layer by means of MOD can be resolved. Also, when lateral face portion 34a is deposited as far as part of the lateral faces of oriented metallic substrate 31, third buffer layer 34 (a CeO layer) penetrates the lateral faces of rough oriented metallic substrate 31, and first buffer layer 32 and second buffer layer 33 become more resistant to peeling.

Also, in this embodiment, through the provision of buffer layers including three-layer buffer layer structure including first buffer layer 32, second buffer layer 33, and third buffer layer 34 formed sequentially on biaxially-oriented oriented metallic substrate 31, first buffer layer 32 takes on the in-plane crystal orientation of oriented metallic substrate 31 as a oriented metallic substrate 31 template and prevents diffusion of elements composing the metallic substrate into the superconductive layer by means of second buffer layer 33 laminated thereon, and third buffer layer 34 controls the orientation of the oxide superconductor layer laminated thereon, so that diffusion of elements composing oriented metallic substrate 31 and cracking in the buffer layers can be prevented. Furthermore it is possible to keep the in-plane crystal orientation of the oxide superconductor layer the same as that of oriented metallic substrate 31, and a tape-shaped oxide superconductor with excellent superconductivity can be obtained.

Example

A Ce—Gd—O-class oxide layer serving as first buffer layer 32 and a Ce—Zr—O-class oxide layer serving as second buffer layer 33 were formed by means of MOD on a 70 μm thick Ni-based alloy substrate (oriented metallic substrate 31). X-ray diffraction measurement showed a Δφ (half width) value for the crystal orientation of Ni-based alloy substrate 1 of 6.5 degrees.

Ce—Gd—O-class oxide layer 32 was formed by applying a mixed solution of octylic acid, naphthenic acid, neodecanoic acid, or suchlike organometallic salts, containing Ce and Gd in a predetermined molar ratio by dip coating, preheating the applied solution at a temperature of 100 to 400° C., and then baking the solution within a temperature range of 900 to 1200° C. for crystallization.

Ce—Zr—O-class oxide layer 33 was deposited on Ce—Gd—O-class oxide layer 2 by means of the same kind of method as described above, using a mixed solution of octylic acid, naphthenic acid, neodecanoic acid, or suchlike organometallic salts, containing Ce and Zr in a molar ratio of Ce:Zr=50:50. The film thickness at this time was 100 nm.

A $CeO_2$ oxide film with a thickness of 150 nm was deposited on Ce—Zr—O-class oxide layer 33 as third buffer layer 34 by means of RTR RF-magnetron sputtering and using a $CeO_2$ target, with the Ni-based alloy substrate (oriented metallic substrate 31) controlled within a temperature range of 400 to 750° C.

A YBCO superconductive layer was deposited by means of TFA-MOD on the three-layer-structured buffer layers formed as described above. As deposition conditions at this time, a coating of an organometallic salt mixed-material solution containing trifluoroacetate (TFA) was applied on the $CeO_2$ oxide layer, and then deposition was performed by actual baking within a temperature range of 710 to 780° C. of a preliminary baked film formed by preliminary baking. The total pressure range during baking was 5 to 800 Torr, the oxygen partial pressure range was 100 to 5000 ppm, and the water vapor partial pressure range was 2 to 30%. The thickness of the YBCO superconductive layer deposited in this way was 1 μm.

In a tape-shaped oxide superconductor formed in the above-described way, the second buffer layer is actually extended to the lateral faces of the first buffer layer in Embodiment 1, and the third buffer layer is actually extended to the lateral faces of the second buffer layer in Embodiment 2. This second buffer layer and third buffer layer are so named for convenience, and it is only necessary for the oxide superconductor layer to be laminated above them.

Examples 1 and 2 are configurations of a second buffer layer when viewed from the two layers—first and second buffer layers—of Embodiment 1. More specifically, in Example 1 the second buffer layer is deposited as far as ½ of the lateral faces of the first buffer layer, and in Example 2 the second buffer layer is deposited as far as the lateral faces of the substrate. Also, Example 3 is a configuration of the three-layer-structured first through third buffer layers of Embodiment 2.

With the configurations of Examples 1 through 3 in which the second buffer layer (the third buffer layer in Embodiment 2) is extended to the lateral faces of the buffer layer or substrate constituting a layer below it, it was confirmed that, as compared with a comparative example in which buffer layer deposition is not performed as far as the lateral faces, in a satisfactory state in which there is no peeling, Jc is 2.0 or above, and Ic is 300 A or above at any location in the lengthwise direction (length: 100 m) of the substrate.

The above description presents illustrations of preferred embodiments of the present invention, but the scope of the present invention is not limited to these.

For example, it is only necessary for the second buffer layer to extend to the lateral faces of the first layer, and the first and second buffer layers may be any of the buffer layers between the metallic substrate and the oxide superconductor layer. Also, the first buffer layer may be composed of a plurality of buffer layers.

Also, in Embodiment 1, deposition by means of RTR RF-magnetron sputtering proceeds simultaneously for second buffer layer (cap layer) 14 and lateral face portion 14a $CeO_2$ film. However, tape deposited by means of any deposition method—for example, MOD, PLD, sputtering, or RF-sputtering—may be used as long as it is oxide superconductor tape provided with an acid-resistant cap layer (for example, a $CeO_2$ film) on the lateral faces of first buffer layer (seed layer) 12. The same also applies to Embodiment 2.

Furthermore, one of the following may be selected for the high-strength tape-shaped metallic substrate: hastelloy, stainless steel, an Ni alloy, Ag or an Ag alloy.

Moreover, $RE_{1+X}Ba_{2-X}Cu_3O_Y$ (where RE indicates one or more members selected from Y, Nd, Sm, Gd, Eu, Yb, or Ho; Ho indicates holmium; and x is 6 to 7) may be used for YBCO superconductive layer 21.

Also, in the above embodiments, the terms tape-shaped oxide superconductor, and tape-shaped oxide superconductor manufacturing apparatus and manufacturing method, have been used, but this is simply for convenience of description, and terms such as oxide superconductor tape, superconductor tape, and oxide superconductor tape manufacturing apparatus and manufacturing method, may also be used. Furthermore, Y-class superconductor tape may also be referred to as YBCO superconductor tape, and tape may also be referred to as YBCO tape, or the like.

Moreover, the type, number, and so forth of parts configuring an above oxide superconductor and oxide superconductor manufacturing apparatus—for example, buffer layers with regard to an oxide superconductor, and a film deposition apparatus and method with regard to an oxide superconductor manufacturing apparatus and method—are not limited to those in the above embodiments.

The disclosure of Japanese Patent Application No. 2010-029119, filed on Feb. 12, 2010, including the specification, drawings and abstract, is incorporated herein by reference in its entirety.

INDUSTRIAL APPLICABILITY

An oxide superconductor tape and a method of manufacturing oxide superconductor tape according to the present invention can be applied to oxide superconductor tape that enables superconductor tape elongation and characteristics to be improved, and stable characteristics to be obtained over the entire length thereof. An oxide superconductor tape according to the present invention is suitable for use in superconductive cables and equipment such as electric power equipment and power equipment.

REFERENCE SIGNS LIST

10 Y-class superconductor tape
11 Non-oriented metallic substrate
12, 32 First buffer layer
13 tape
14, 33 Second buffer layer
14a, 34a Lateral face portion
20, 30 Tape-shaped oxide superconductor
21 YBCO superconductive film
31 Oriented metallic substrate
34 Third buffer layer
100 Film deposition apparatus
101a, 101b Tape holder
102 tape heater
110 RF-Sputtering apparatus
111 Target
120 RTR tape moving mechanism
121, 122 Turn reel
130 Multi-turn mechanism

The invention claimed is:

1. An oxide superconductor tape comprising:
a tape-shaped metallic substrate;
a first buffer layer disposed on the tape-shaped metallic substrate; and
a second buffer layer disposed on the first buffer layer, wherein the second buffer layer is extended to a lateral face of the first buffer layer.

2. The oxide superconductor tape according to claim 1, wherein the first buffer layer includes one or more buffer layers, and the second buffer layer is formed directly beneath an oxide superconductor layer.

3. The oxide superconductor tape according to claim 1, wherein the second buffer layer is a thin film that is more acid-resistant than the first buffer layer.

4. The oxide superconductor tape according to claim 1, wherein the second buffer layer is a $CeO_2$ film.

5. The oxide superconductor tape according to claim 1, wherein a thickness of the lateral face of the second buffer layer is ⅕ or less of a thickness of a principal surface of the second buffer layer.

6. The oxide superconductor tape according to claim 1, wherein the second buffer layer is extended so as to cover at least ½ of the lateral face of the first buffer layer.

7. The oxide superconductor tape according to claim 1, wherein the second buffer layer is extended to a lateral face or a bottom face of the tape-shaped metallic substrate.

8. The oxide superconductor tape according to claim 3, wherein the oxide superconductor layer is composed of REBaCuO deposited by means of MOD where RE indicates one or more members selected from Y, Nd, Sm, Gd, Eu, Yb, or Ho.

9. A method of manufacturing an oxide superconductor tape for depositing a second buffer layer on a tape in which a first buffer layer composed of one or more layers is deposited on a tape-shaped metallic substrate, the method comprising:
moving the tape between a pair of turn reels at a constant speed through a sputtering deposition area;
looping back the tape that moves through the sputtering deposition area through a plurality of turns, with portions of the tape being separated from each other by a predetermined interval; and
depositing a vapor deposition material discharged from a target so as to wrap around a lateral face of the tape so that the second buffer layer forms a thin film that is extended to a lateral face of the first buffer layer.

* * * * *